United States Patent
Polizzi et al.

(12)

(10) Patent No.: US 6,271,571 B1
(45) Date of Patent: Aug. 7, 2001

(54) UPROM MEMORY CELLS FOR NON-VOLATILE MEMORY DEVICES INTEGRATED ON SEMICONDUCTORS

(75) Inventors: Salvatore Polizzi, Palermo; Marco Lauricella, Gravina, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/276,263

(22) Filed: Mar. 25, 1999

(30) Foreign Application Priority Data

Mar. 26, 1998 (IT) ................................................. I98A0628

(51) Int. Cl.[7] .................................................. H01L 29/72
(52) U.S. Cl. .......................... 257/390; 257/299; 257/321; 257/392; 257/396
(58) Field of Search ..................................... 257/390, 392, 257/396, 321, 299

(56) References Cited

U.S. PATENT DOCUMENTS 6,140,181 * 10/2000 Forbes et al. ......................... 257/321

* cited by examiner

*Primary Examiner*—Edward Wojciechowicz
(74) *Attorney, Agent, or Firm*—Theodore E. Galanthay; David V. Carlson; Seed IP Law Group PLLC

(57) ABSTRACT

A redundancy UPROM cell includes at least one memory element of EPROM or Flash type, having a control terminal and a conduction terminal to be biased, an inverter register connected to the memory element by at least one MOS transistor. Such cell also includes a pass transistor which connects said conduction terminal to a data line and a pull-up transistor which connects the data line to a supply voltage reference. The UPROM cell has the great advantage to result in smaller dimensions in comparison with the cells of known type, at equal final functions and performances being assumed.

22 Claims, 5 Drawing Sheets

UPROM MEMORY CELLS FOR NON-VOLATILE MEMORY DEVICES INTEGRATED ON SEMICONDUCTORS

TECHNICAL FIELD

The present invention relates to UPROM memory cells for non-volatile memory devices integrated on semiconductors.

More specifically, but not exclusively, the invention relates to a UPROM redundancy cell incorporating at least one memory element of EPROM or flash type, having a control terminal and a conduction terminal to be driven, a register with inverters connected to the memory element by at least one transistor.

BACKGROUND OF THE INVENTION

As is well known, one of the main difficulties that are encountered when producing memory devices integrated on semiconductors on very large-scale basis is the yield of the respective production process. It happens indeed that at the end of the production process, the defectiveness of the memory cell matrix is such to render the device not usable. The cell matrix takes up the prevalent part of the circuitry area of the memory device and the probability is therefore very high that a serious production defect could arise just in the circuitry portion taken up by the matrix.

As the integrated memory devices of EPROM and flash type have a relatively low yield, the prior art has tried to find a remedy for this drawback by equipping the cell matrix with additional rows and/or columns that can be used to replace defective rows or columns that show malfunction following the testing of the device. In order to use the redundant rows and columns it is necessary to have memory elements, called UPROM cells available for the addressing of redundancy.

Those skilled in the art have a through knowledge of the design and use techniques of the redundancy rows and columns and of the respective selection circuitry. The latter allows a re-addressing of the memory in such a way to replace the addresses containing defective bits with the functioning ones existing in the redundancy rows or columns.

At present, the continuous evolution of the technology and the general trend to cost reduction in the semiconductor market leads to the design of memory devices that, their performance being equal, take up a smaller circuit area.

In FIG. 1 there is shown a schematic view of a UPROM redundancy cell realized according to the prior art.

The UPROM redundancy cell comprises at least one memory element P0 of EPROM or Flash type, which has a control terminal and a conduction terminal X to be driven. The cell furthermore includes a latch register constituted of two inverters I1, I2 connected to the memory element, as well as MOS transistors (represented by M2) which connect the memory element to a power supply reference Vdd at low voltage.

In a first power-up phase, by means of a transistor M16 receiving a high signal POR, the latch is unbalanced in such a way to have a logic "0" on the side of the "q" node and a logic "1" on the side of the "latch" node.

If the Flash cell P0 was written, i.e., if its threshold voltage was greater than 4 or 5 V, it would not absorb current and therefore the latch would stay in its state of rest.

If instead the Flash cell P0 is erased, i.e., if it has a threshold voltage lower than 2.5 V, it will start to conduct when the two voltage values UGV and Vb will have reached their steady state operation value, equal to about 3 V and 1.5 V respectively. At this point latch 2 could be unbalanced and taken into a state in which the I1 inverter output is at a high logic value while the I2 inverter output is at a low logic value.

Even if advantageous upon different points of view, this solution does not offer particularly reduced dimensions as it requires as cell equipment various types of transistors to carry out the different operations of set, reset, reading and programming.

SUMMARY OF THE INVENTION

An embodiment of the present invention is directed to a UPROM cell having such structural and functional features to take up a particularly reduced circuit area and even being suitable for working at a low power supply voltage.

The embodiment allows the realization of UPROM matrix cells in such a way to share the same switch and XOR circuits for different cells.

This would overcome the limits and the drawbacks of the actual solutions suggested by the prior art for memory devices at low voltage.

The embodiment includes a UPROM memory element incorporating a Flash cell and a latch register connected to each other and to the external circuitry though pass transistors.

The UPROM memory element includes a pass transistor which connects a conduction terminal of the Flash cell to a data line. Advantageously, a pull-up transistor is associated to the cell to connect the data line to a power supply voltage reference. The pull-up transistor is in common with a plurality of cells associated with a common data line.

The features and the advantages of the UPROM memory element will become clear from the following description of an embodiment thereof, which is herein given as example for illustrative and not limiting purposes with reference to the attached drawings.

DETAILED DESCRIPTION

Figure 1:
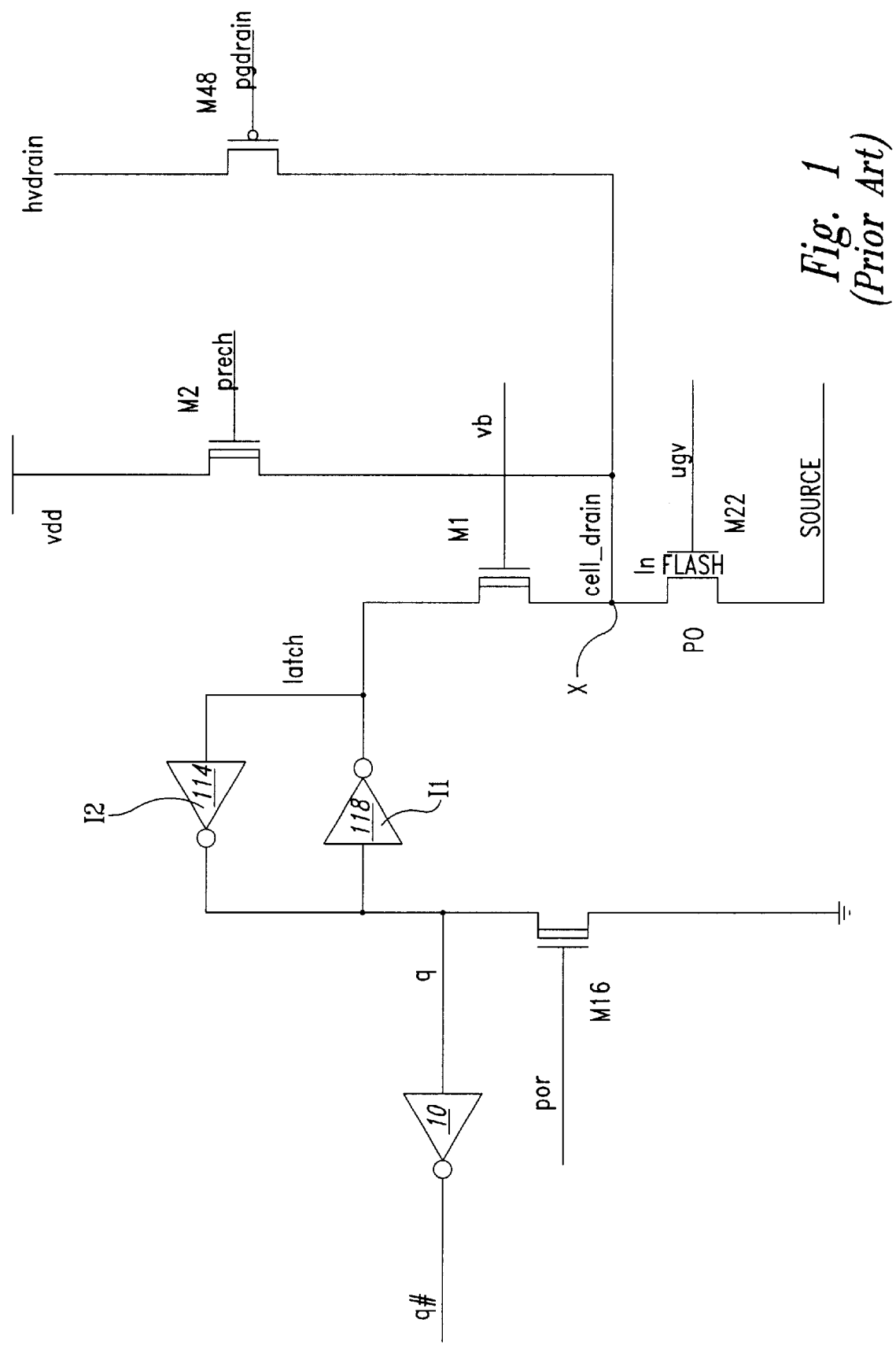
FIG. 1 shows a schematic view of a UPROM memory cell realized according to the prior art.

With reference to such drawings, the structure of a UPROM memory cell realized according to an embodiment of the present invention is indicated with 1.

The cell 1 is integrated in a semiconductor memory device, particularly of the EPROM or Flash type, operating at a low supply voltage. The memory device is not represented in the drawings, but typically is of the type comprising a memory cell matrix organized in rows and columns and connected to a circuitry for control, selection and decodification.

The cell 1 is supplied by a supply voltage Vdd, having a value between 2.5 and 3.6 volts, and is inserted between such supply Vdd and a second voltage reference GND, for example a signal ground.

Figure 4A:
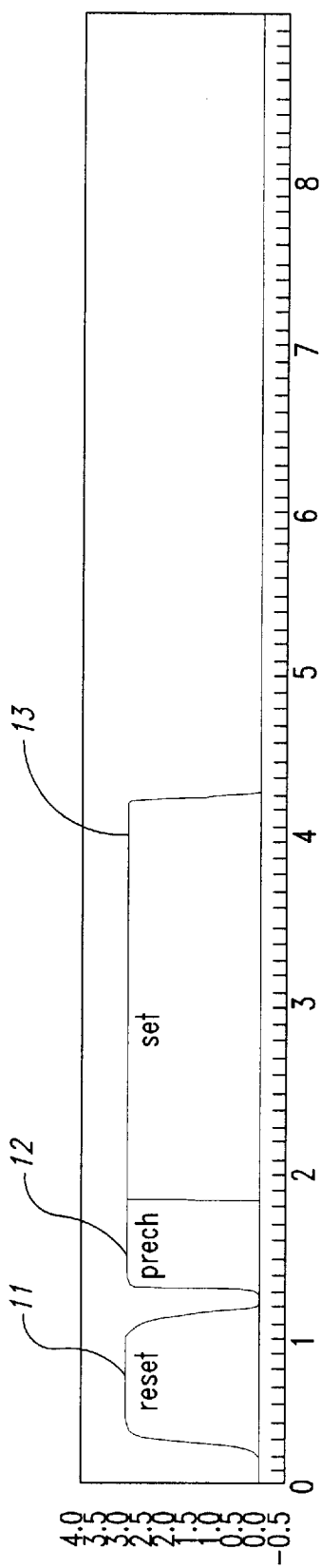
FIGS. 4A, 4B, 4C, 4D and 4E show respective diagrams of a pattern as a function of time of some values of voltage given in the cell of FIG. 2.

The UPROM cell 1 comprises a memory element, represented by a floating gate cell F, of EPROM or Flash type, which contains a binary code of a redundant address. Such cell F is constituted by a floating gate transistor with a control gate CG to which is applied a voltage signal UGV. The pattern of the signal UGV as a function of time is shown in FIG. 4A.

On the source terminal of the cell F exists a source signal, while the other conduction terminal, drain D, is connected to a data line b1 through a MOS P-Channel pass transistor M8 at a high voltage which receives a prog_prech signal on its gate terminal. The pass transistor M8 has its body terminal connected to the voltage Vdd.

The body terminal of the transistor M8 can be also connected to a programming voltage reference Vp during the programming phase of the Flash cell F.

As an alternative to the P-Channel transistor M8, a MOS N-channel transistor can be used with a gate terminal suitably boosted with respect to the programming voltage which represents the bulk reference.

The pass transistor M8 can also be used during the test-mode phase DMA of the cell F to allow a direct approach to the cell and the reading of the current absorbed therein.

Figure 3:
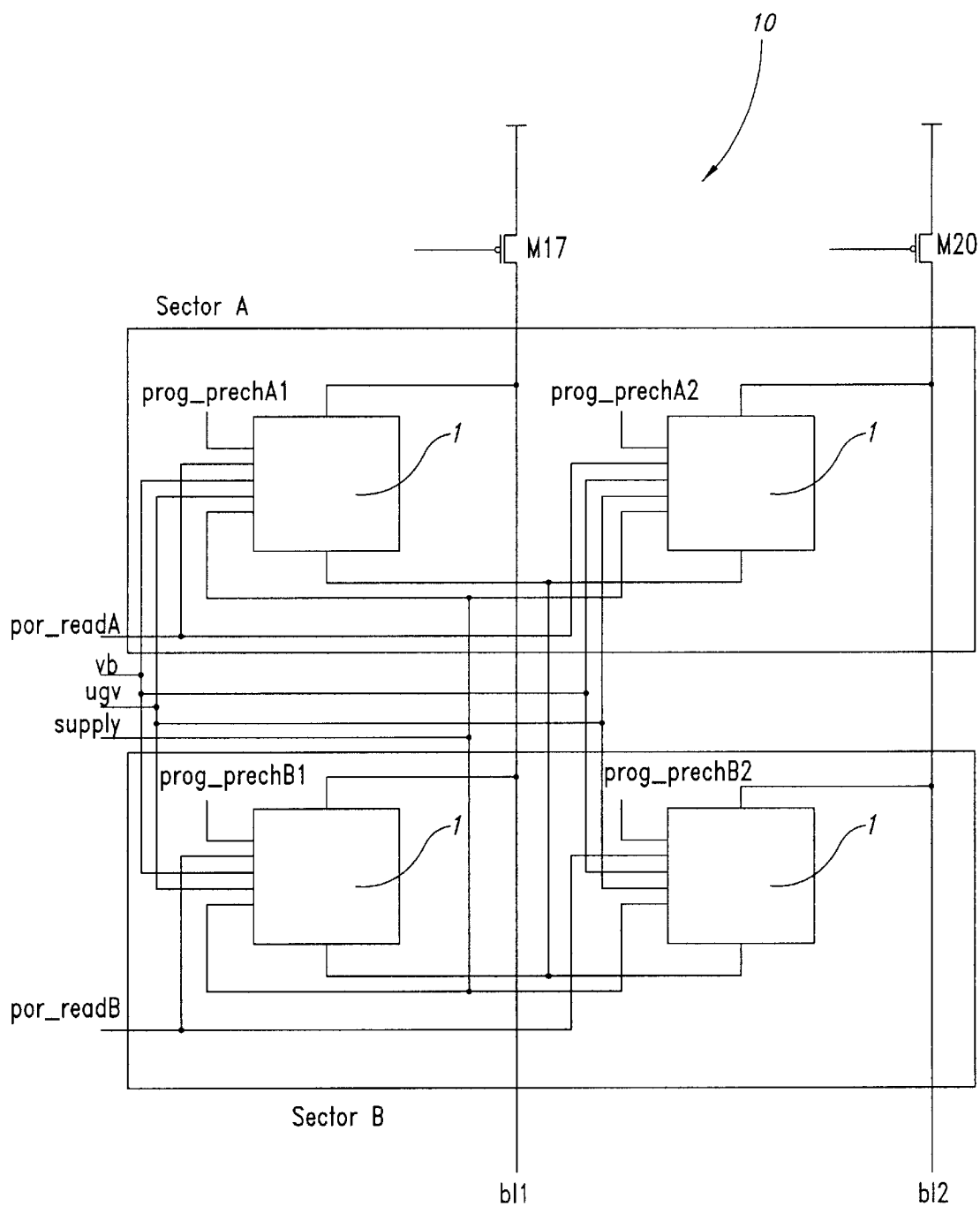
FIG. 3 shows a schematic view of an example of integration of four cells according to an embodiment of the invention for two different addresses of two different sectors of a Flash memory device.

The data line b1 represents a kind of bit line for a small matrix of UPROM cells, for example as shown in FIG. 3.

The basic structure of the UPROM cell 1 also comprises a first I4 and a second inverter I6 connected to each other in a latch configuration. That is, the first inverter I4 has an input terminal AL and an output terminal BL respectively connected to an output terminal and an input terminal of the second inverter I6.

A MOS transistor M5 of the N-channel type connects the input AL of the first inverter I4 to the line b1. A natural, second MOS transistor M3 of the N-channel type connects the output BL of the first inverter I4 to the drain terminal D of the memory element F in a source follower configuration.

The power terminal of the cell F receives the signal UGV while a signal $por_{13}$ read and a voltage signal Vb are applied to the control terminals of the transistors M5 and M3, respectively.

Figure 4B:
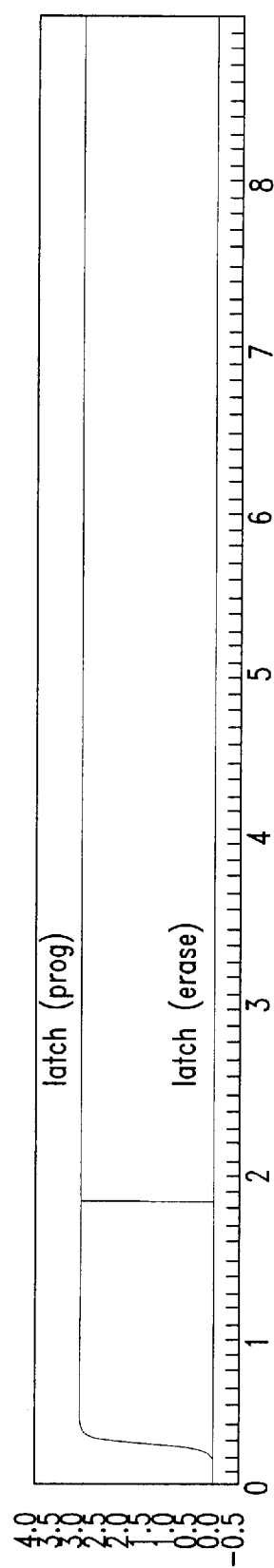
Figure 4C:
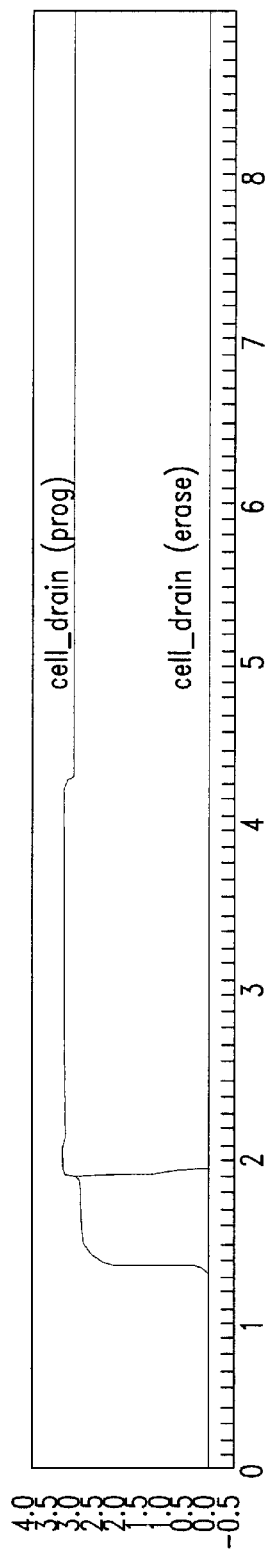
Figure 4D:
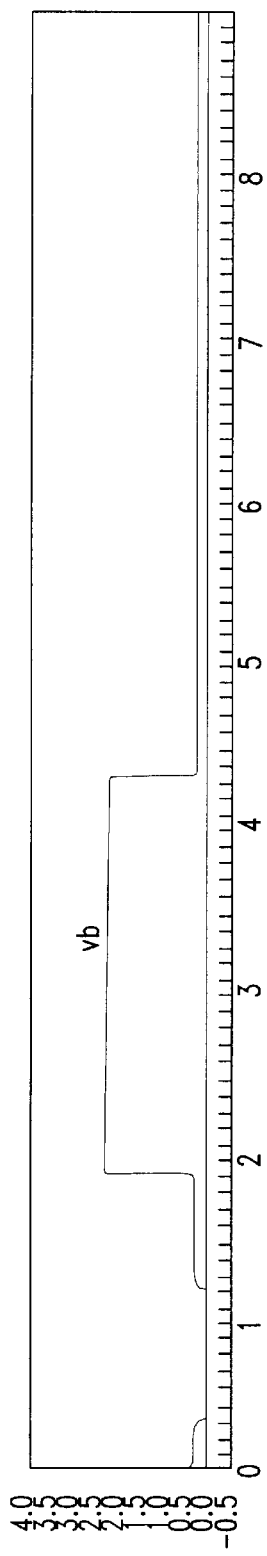

The pattern of the signal Vb as a function of time is shown in FIG. 4D, while the signal por_read is produced within the memory device by a switch on and initialisation circuit portion known as POWER ON RESET.

The inverters I4 and I6 constitute a latch type register and the transistors M5 and M3 update the latch state according to the state of the non-volatile Flash cell F.

To the UPROM cell is connected a P-Channel transistor M6 which connects the line b1 to the supply Vdd. The transistor M6 receives on its gate terminal a signal readn. Advantageously, the transistor M6 is common to all the UPROM cells which are all connected to the same data line b1.

More particularly, as shown in FIG. 3, a pull-up transistor is foreseen for each set of cells connected to a same data line. In FIG. 3 the transistor M17 is connected to the cells 1 connected to the line b11 and the transistor M20 is connected to the cells connected to the line b12.

This feature allows one to maintain compact the structure of the cell 1 and, accordingly, of the small matrix of cells 1 which can be created with them.

It is now described the operation of the UPROM cell 1 starting from an initial state in which the memory device is switched on.

In a first phase, the latch formed by inverters I4 and I6 is reset by means of a logic "0" transferred from the line b1 through the transistor M5 activated by the signal POR_READ.

In a second phase the node D is loaded with a logic "1" transferred from the line b1 through the transistor M8 activated by the signal prog_prech.

In a third phase the contents of the Flash cell F are read through the proper activation of the transistor M3. If the cell has been erased the latch state will be changed by the current "pulled" by the cell.

From now on the latch will keep the redundancy information of the bad functioning address and such information will be transferred onto the line b1 by means of the switching on of the transistor M5.

The programming of the Flash cell F needs a high voltage on the drain terminal D. Such voltage is supplied on the bit line b1 by means of the transistor M8 which has its bulk connected respectively to the programming voltage or to the supply voltage Vdd according to whether a Flash cell programming or any other operation needs to be carried out.

From the same line b1 it is therefore possible to implement the latch reset by means of the transistor M5. With an opportune decoding of M5, in fact, it is possible to implement the reading of the contents of the latch itself and, by means of the transistor M8, the pre-charge of the node D and the programming of the Flash cell F.

The transistor M3 is dedicated instead to the reading of the Flash cell F and therefore to the transferral of the information to the above latch.

During the reading of the contents of the latch the line b1 is connected to the supply Vdd by the pull-up P-Channel M6 piloted by the signal readn (which is in this phase at a "0" logic level). Such transistor M6 is more resistive than the N-channel transistor integrated in the inverter I6 in such a way to guarantee a logic level equal to "0" at the BL node when the latch is unbalanced as in reset phase. Moreover, the presence of the transistor M6 guarantees the following advantages:

1) no loss of threshold due to the transistor M5 reading a logic "1" from the node AL occurs.
2) this arrangement makes it possible to connect the same line b1 to more UPROM cells of the same type, for example UPROM cells relative to different matrix blocks of the same flash memory.

To access the latch it is sufficient to decode the switching on of the transistor M5 with a block address.

In FIG. 3 a possible implementation is represented of a small matrix 10 formed by four UPROM cells 1 relative to two different addresses A<0> and A<1> of two different sectors A and B of a same flash memory. From this figure it is possible to notice the advantage of having a structure with unique pull-up for line b1. Therefore, bl <0>, bl <1> represent a unique bus common to the two memory sectors A and B.

Figure 2:
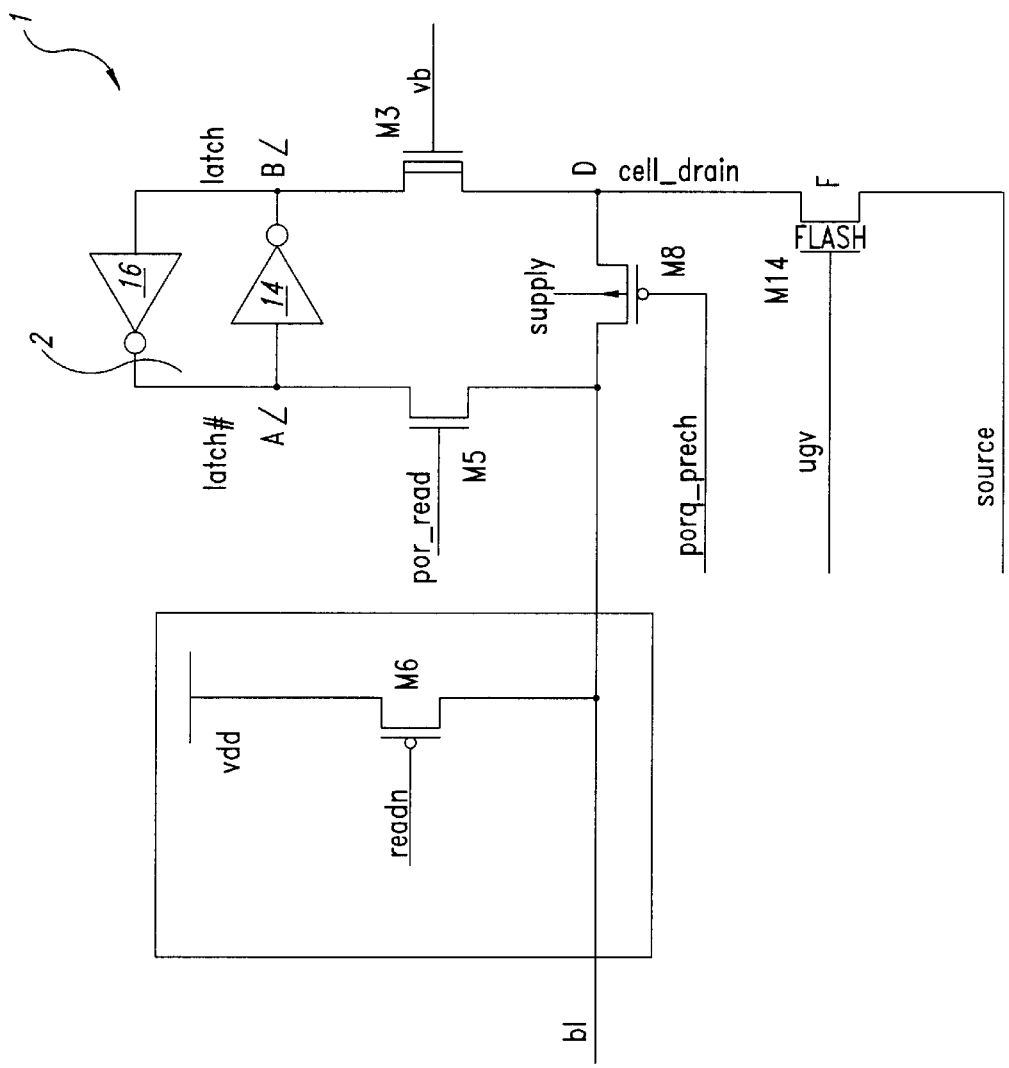
FIG. 2 shows a schematic view of a UPROM memory cell according to an embodiment of the present invention.

In the FIGS. 4A, 4B, 4C, 4D and 4E respective diagrams are shown of the patterns as a function of time of some voltage values present in the cell of FIG. 2.

For example, in FIG. 4A it is possible to see a phase of switching on or Power Up and reading of the latch contents for the UPROM cell F of FIG. 2. In particular, the three phases indicated with 11, 12 and 13 respectively are visible for the latching, pre-charge and set of the latch, both for an erased cell F and for a programmed cell F.

To this respect a comparison can also be made with respect to FIGS. 4B and 4C for the nodes "latch" (BL) and D.

FIG. 4D shows instead the pattern of the voltage Vb in the latch setting phase.

Figure 4E:
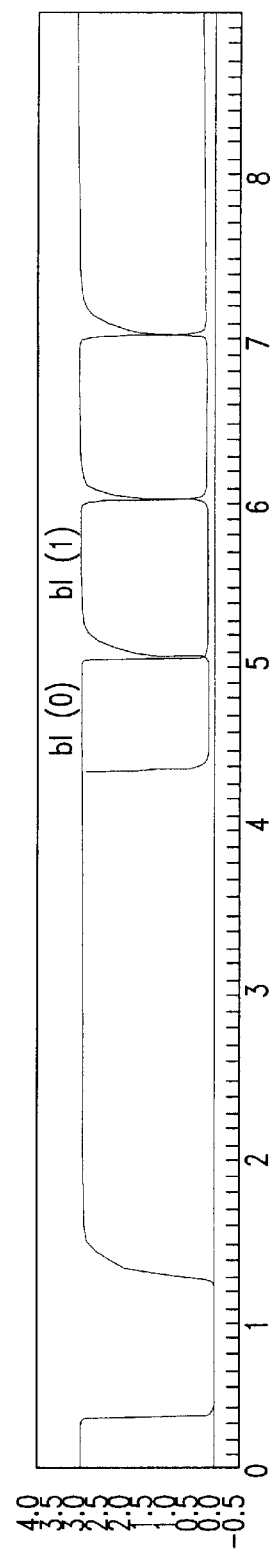

Finally, FIG. 4E at the bottom shows the pattern of two lines b1 during the alternate reading of two UPROM cells, one deleted and one programmed.

The UPROM cell discussed above has the great advantage to result in lower dimensions compared to the cells of known type, at equal final functions and performances being assumed.

This advantage is mainly due to the fact of having used same transistors which carry out different functions to allow different operation such as reset, set, reading and programming.

Further on, thanks to the use of a common pull-up transistor M6, the use of a same data line b1 able to serve more cells of different memory blocks is quite advantageous, in terms of area taken up.

This advantage becomes true by rendering possible the realization of a small matrix of UPROM cells which share the same circuitry of switch, XOR, etc.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A redundancy UPROM cell, comprising a memory element of EPROM or Flash type having a power terminal and a conduction terminal to be driven, the UPROM cell including an inverter register connected to the memory element by a MOS transistor; and a pass transistor which connects said conduction terminal to a data line.

2. The cell according to claim 1, further comprising a pull-up transistor that connects the data line to a supply voltage reference.

3. The cell according to claim 2, wherein said pull-up transistor has a gate terminal that receives an enabling signal.

4. The cell according to claim 2, wherein said pull-up transistor is coupled to another UPROM cell coupled to the data line.

5. The cell according to claim 1, wherein said pass transistor is a MOS P-Channel transistor at high voltage and having a gate terminal that receives an enabling signal.

6. The cell according to claim 1, wherein said pass transistor has its body terminal connected to a supply voltage reference.

7. The cell according to claim 1, wherein said pass transistor is a MOS N-channel transistor having body and gate terminals connected to each other and to a programming voltage reference.

8. The cell according to claim 1, wherein the inverter register includes a first and a second inverter each having an input terminal connected to an output of the other inverter; the cell further comprising a MOS N-channel transistor connecting the input terminal of the first inverter to said data line; and a natural MOS N-channel transistor connecting the output of the first inverter to the conduction terminal of the memory element.

9. The cell according to claim 8, wherein the MOS N-channel transistor and the natural MOS N-channel transistor include respective control terminals respectively receiving first and second voltage control signals.

10. A UPROM cell matrix, comprising a plurality of cells according to claim 1 which are orderly associated in groups, each group including a plurality of cells coupled to a respective data line associated with the group; the matrix including a plurality of pull-up transistors respectively connecting the respective data lines to a supply voltage reference.

11. A non-volatile memory cell matrix, comprising:
a first group of memory cells each including a memory element and a register having an input and an output, the output being coupled to the memory element;
a first data line coupled to each memory cell of the first group; and
a first pull-up transistor coupling the first data line to a supply voltage reference.

12. The matrix of claim 11 wherein each of the memory cells includes a pass transistor coupling the register output and memory element of the memory cell to the first data line.

13. The matrix of claim 12 wherein the pass transistor of each of the memory cells includes a body terminal coupled to a programming voltage high enough to program the memory element of the memory cell.

14. The matrix of claim 11 wherein each of the memory cells includes first and second transistors that respectively couple the register input and output of the memory cell with the first data line.

15. The matrix of claim 11 wherein each of the memory cells includes a first transistor coupled between the first data line and the memory element of the memory cell and a second transistor coupled between the memory element and the register of the memory cell.

16. The matrix of claim 11, further comprising:
a second group of memory cells each including a memory element and a register having an input and an output coupled to the memory element of the memory cell;
a second data line coupled to each memory cell of the second group; and
a second pull-up transistor coupling the second data line to the supply voltage reference.

17. The matrix of claim 11 wherein the memory element of each memory cell is a flash memory element.

18. A method of controlling a redundancy memory cell that includes a memory element and a register, the method comprising:
resetting the register by coupling an input of the register to a data line carrying a reset signal; and
programming the memory element by coupling the data line to a conductive terminal of the memory element and driving a high voltage programming signal on the data line to the conductive terminal.

19. The method of claim 18, further comprising reading the memory element using a read transistor coupled between the memory element and the register.

20. The method of claim 18, further comprising reading the register by coupling the data line to the register input with a read transistor and decoding the read transistor when the read transistor is activated.

21. A redundancy UPROM cell, comprising:
a non-volatile memory element having a conduction terminal and a control terminal;
a data latch register having an input terminal coupled to the conduction terminal of the memory element by a first MOS transistor, and having an output terminal coupled to a data line; and
a pass transistor having a first conduction terminal coupled to the data line and having a second terminal coupled to the conduction terminal of the memory element.

22. A non-volatile memory matrix grouped into at least a first and a second sector, the matrix comprising:
- a plurality of UPROM cells, each cell including:
  - a non-volatile memory element having a conduction terminal,
  - a data register coupled to the conduction terminal of the non-volatile memory element and having an output terminal, and
  - a pass transistor coupled between the output terminal and the conduction terminal of the non-volatile memory element;
- a first data line coupled to the output terminal of one of the UPROM cells in the first sector and coupled to the output terminal of one of the UPROM cells in the second sector;
- a first pull-up transistor coupling the first data line to a supply voltage reference;
- a second data line coupled to the output terminal of a second one of the UPROM cells in the first sector and coupled to the output terminal of a second one of the UPROM cells in the second sector; and
- a second pull-up transistor coupling the second data line to the supply voltage reference.

* * * * *

UNITED STATES PATENT AND TRADEMARK OFFICE
CERTIFICATE OF CORRECTION

PATENT NO. : 6,271,571 B1
DATED : August 7, 2001
INVENTOR(S) : Salvatore Polizzi et al.

It is certified that error appears in the above-identified patent and that said Letters Patent is hereby corrected as shown below:

Title page,
Item [30], Foreign Application Priority Data,
The foreign priority application number should read -- MI98A000628 --.

Signed and Sealed this

Twenty-sixth Day of February, 2002

Attest:

Attesting Officer

JAMES E. ROGAN
Director of the United States Patent and Trademark Office